(12) United States Patent
Meagher

(10) Patent No.: US 9,143,142 B2
(45) Date of Patent: Sep. 22, 2015

(54) TRANSPARENT TIMING OF A STRATUM SYNCHRONIZED ETHERNET SIGNAL USING STANDARD OPTICAL TRANSPORT NETWORK RATES

(75) Inventor: Kevin S. Meagher, Bowie, MD (US)

(73) Assignee: Ciena Corporation, Hanover, MD (US)

( * ) Notice: Subject to any disclaimer, the term of this patent is extended or adjusted under 35 U.S.C. 154(b) by 769 days.

(21) Appl. No.: 13/353,968

(22) Filed: Jan. 19, 2012

(65) Prior Publication Data

US 2013/0188964 A1    Jul. 25, 2013

(51) Int. Cl.
| | |
|---|---|
| *H04B 10/40* | (2013.01) |
| *H04B 10/69* | (2013.01) |
| *H03L 7/18* | (2006.01) |
| *H04J 3/16* | (2006.01) |
| *H04J 3/06* | (2006.01) |

(52) U.S. Cl.
CPC .............. *H03L 7/18* (2013.01); *H04J 3/0638* (2013.01); *H04J 3/1658* (2013.01); *H04B 10/40* (2013.01); *H04B 10/69* (2013.01); *H04J 3/0647* (2013.01); *H04J 3/0658* (2013.01); *H04J 2203/0085* (2013.01)

(58) Field of Classification Search
None
See application file for complete search history.

(56) References Cited

U.S. PATENT DOCUMENTS

| | | | | |
|---|---|---|---|---|
| 7,873,073 | B2 | 1/2011 | Frlan et al. | |
| 2001/0014104 | A1* | 8/2001 | Bottorff et al. | 370/471 |
| 2004/0258188 | A1* | 12/2004 | Kim et al. | 375/376 |

OTHER PUBLICATIONS

International Telecommunications Union, ITU-T G.709/Y.1331, Dec. 2009.*

* cited by examiner

*Primary Examiner* — Darren E Wolf
(74) *Attorney, Agent, or Firm* — Clements Bernard PLLC; Christopher L. Bernard; Lawrence A. Baratta, Jr.

(57) ABSTRACT

A method and system for transparent timing of an Ethernet signal over an optical transport network are disclosed. In one embodiment, a transceiver includes a first clock recovery circuit, a first synchronizer and an asynchronous mapper. The first clock recovery circuit recovers a first clock from a first signal received from an Ethernet network. The first synchronizer multiplies the first clock by a ratio M/N to produce a second clock to time a second signal transmitted over the optical transport network. M and N are integers. The asynchronous mapper maps frames of the first signal to produce frames of the second signal.

20 Claims, 13 Drawing Sheets

TRANSPARENT TIMING OF A STRATUM SYNCHRONIZED ETHERNET SIGNAL USING STANDARD OPTICAL TRANSPORT NETWORK RATES

FIELD

The present invention relates to communication networks and more particularly to transport of synchronous Ethernet over a standard optical transport network.

BACKGROUND

Telecommunication networks increasingly use the Optical Transport Network (OTN) standards for aggregation and transport of Ethernet data traffic. The standard method of mapping Ethernet frames to optical transport unit (OTUk) frames involves terminating the packets and mapping them using generic framing protocol frames (GFP-F). However, GFP-F does not provide synchronization between the timing of the Ethernet network and the timing of the OTN. Consequently, telecommunications providers must add extra equipment to add stratum timing at the egress of the telecommunications network, resulting in increased equipment and operating costs. Further, adding stratum synchronized timing from an external source requires meeting stringent timing wander requirements. Addressing these wander requirements requires complicated and expensive stratum synchronization circuits.

For synchronous 10 Gigabit Ethernet (10GBE), there are transparent timing mappings to over-clocked OTU2x, (such as, for example, OTU1e, at 11.05 Gigabits per second (Gb/s) and OTU2e at 11.09 Gb/s.) These over-clocked signals cannot be passed over a standard OTU2 link or multiplexed into a standard OTU3 link.

Therefore, there is a need for synchronization between an Ethernet link and an OTN link that provides a transparent timing change at a boundary node between the links.

SUMMARY

The present invention advantageously provides a method and system for synchronizing the timing between an Ethernet network and an optical transport network. According to one aspect, a transceiver includes a first clock recovery circuit, a first synchronizer and an asynchronous mapper. The first clock recovery circuit recovers a first clock from a first signal received from an Ethernet network. The first synchronizer multiplies the first clock by a ratio M/N to produce a second clock to time a second signal transmitted over the optical transport network. M and N are integers. The asynchronous mapper maps frames of the first signal to produce frames of the second signal.

According to another aspect, the invention provides a second clock recovery circuit, and a second synchronizer. The second clock recovery circuit recovers a third clock from a third signal received from the optical transport network. The second synchronizer multiplies the third clock by a ratio N/M to produce a fourth clock to time a fourth signal transmitted over the Ethernet network. The asynchronous mapper maps frames of the third signal to produce frames of the fourth signal.

According to another aspect, the invention provides a transceiver that synchronizes the timing between an Ethernet network and an optical transport network. The transceiver includes a receiver, a phase locked loop, a GFP/Ethernet mapper and an ODU2/GFP mapper. The receiver receives a first signal from an Ethernet network and recovers a first clock from the first signal. The phase locked loop converts the first clock to a second clock. The conversion includes multiplying the first clock by a ratio of integers M/N. The GFP/Ethernet mapper maps Ethernet frames received from the Ethernet network clocked at a rate of the first clock to GFP frames clocked at a rate of a third clock derived from the second clock. The ODU2/GFP mapper maps the GFP frames to ODU2 frames clocked at a rate of the second clock.

According to yet another aspect, the invention provides a synchronous clock distribution method. A first clock is recovered from a signal received from an Ethernet network. Frames of the received signal are asynchronously mapped from an Ethernet format to an OTU format. The first clock is multiplied by a ratio of integers, M/N, to obtain a second clock for timing a signal transmitted over an optical transport network. The asynchronously mapped frames are synchronously transmitted according to the second clock to produce the signal transmitted over the optical transport network.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein.

DETAILED DESCRIPTION

Figure 1:
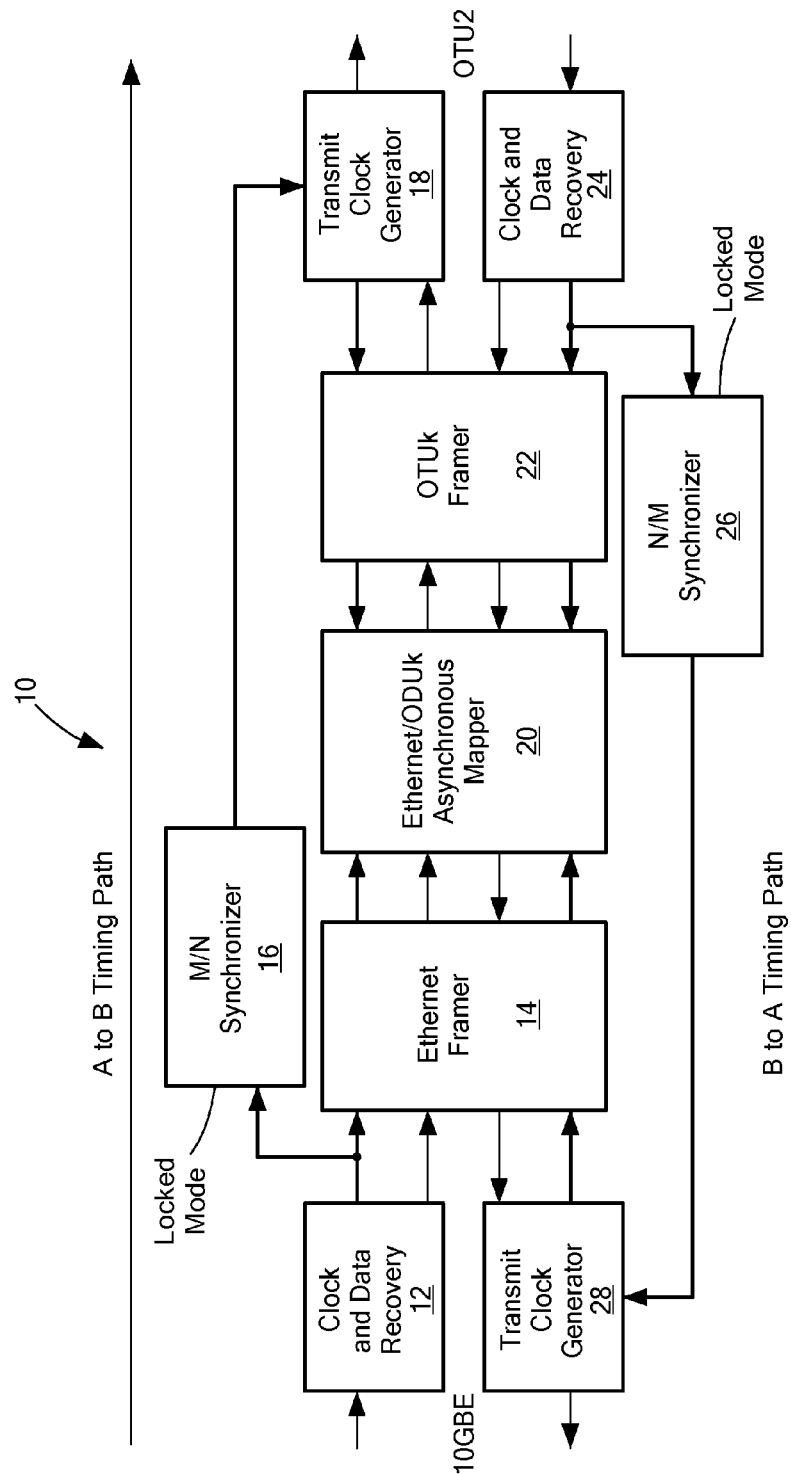
FIG. 1 is diagram of an exemplary transceiver with synchronous clocking and asynchronous mapping constructed in accordance with principles of the present invention.

Before describing in detail exemplary embodiments that are in accordance with the present invention, it is noted that the embodiments reside primarily in combinations of apparatus components and processing steps related to synchronization of timing between an Ethernet network and an optical transport link. Accordingly, the system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

Referring now to the drawing figures, in which like reference designators denote like elements, there is shown in FIG. 1 an exemplary embodiment of a transceiver with synchronous clock generation and asynchronous data mapping constructed in accordance with principles of the present invention and generally denoted as system "10." The system 10 includes a first clock and data recovery unit (CDR) 12 that receives a 10GBE signal from an Ethernet network. The first CDR unit 12 extracts a first clock signal from the received 10GBE signal, and recovers data from the 10GBE signal. In one embodiment, the CDR unit 12 divides the extracted first clock signal by a first integer such as 16, 32, 64, etc., to provide a clock that is sufficiently slow enough to be transmitted on printed circuit board conducting traces and integrated circuit pins. The recovered data is sent to an Ethernet framer 14 which frames the recovered data according to an Ethernet protocol. The clock signal that is extracted from the 10GBE signal and divided down by the first integer is passed to the Ethernet framer 14 and to an M/N synchronizer 16.

The M/N synchronizer 16 may be implemented as a phase locked loop (PLL) or a voltage controlled crystal oscillator (VCXO) that operates in a locked mode. The M/N synchronizer 16 derives a second clock signal from the first clock signal. The output of the M/N synchronizer 16 is forwarded to a first transmit clock generator 18, which generates the second clock signal based on the output from the M/N synchronizer 16. In particular, the first transmit clock generator 18 multiplies the signal by the first integer to generate the second clock signal The ratio of the rate of the second clock signal to the rate of the first clock signal is M/N where, M and N are integers. For example, the first clock may be an Ethernet clock having a frequency of about 10.3125 Giga-Hertz (GHz), and the second clock may be an OTU2 clock having a frequency of about 10.709 GHz. In this case the ratio, M/N, may be chosen as 27/26, resulting in an offset between the second clock and a standard OTU2 clock of 10.709225316 GHz of about 8.47 parts per million (ppm). Thus, the rate of the OTU2 bit stream leaving the Transmit Clock generator is 10.709 Gbps. The rate of the transmit clock fed to OTUk Framer 22 is usually $1/16^{th}$, $1/32^{nd}$, $1/64^{th}$, etc. of the 10,709 Gbps rate. The output of the M/N synchronizer is also usually $1/16^{th}$, $1/32^{nd}$, $1/64^{th}$, etc. of the 10.709 Gbps. The transmit clock generator 18 multiplies the M/N output clock up to the 10.709 Gbps for the OTU2 output stream and divides down (or multiplies up) the M/N output for the OTU2 framer. Thus, the various clock rates may be different, but are synchronous to each other, since division or multiplication of a clock rate is by an integer or ratio of integers.

As another example, the second clock may be an ODU2 clock having a frequency of about 10.037. In this example, the ratio, M/N, may be chosen as 474/487, resulting in an offset between the second clock and a standard ODU2 clock of 10.03727392405 GHz of about 5.61 ppm. Note that the clock rates at which the Ethernet framer 14, the asynchronous mapper 20, and the OTUk framer 22 operate may be obtained by division of the ODU2 clock by an integer such as 16, 32, 64, etc., to obtain a clock rate of 645 MegaHertz (MHz), 322 MHz, etc. These much lower frequencies are suitable for operation on a printed circuit board and for integrated circuit pins.

As yet another example, the second clock may be an OC192 or STM64 clock having a frequency of about 9.953 GHz. In this example, the ratio, M/N, may be chosen as 194/201, resulting in an offset between the second clock and a standard OC192/STM64 clock of 9.53280000 GHz of about −7.86 ppm. Exemplary values of M and N and the resulting offsets in parts per million are shown in Tables 1, 2 and 3.

TABLE 1

Example M/N for Synchronous 10GBE transport over OTU2

| M | N | 10GBE | Result | OTU2 | Offset (PPM) |
|---|---|---|---|---|---|
| 27 | 26 | 10,312,500,000.00 | 10,709,134,615.38 | 10,709,225,316.46 | 8.47 |
| 2,132 | 2,053 | 10,312,500,000.00 | 10,709,327,812.96 | 10,709,225,316.46 | −9.57 |

TABLE 2

Example M/N for Synchronous 10GBE transport over ODU2

| M | N | 10GBE | Result | ODU2 | Offset (PPM) |
|---|---|---|---|---|---|
| 474 | 487 | 10,312,500,000.00 | 10,037,217,659.14 | 10,037,273,924.05 | 5.61 |
| 547 | 562 | 10,312,500,000.00 | 10,037,255,338.08 | 10,037,273,924.05 | 1.85 |
| 620 | 637 | 10,312,500,000.00 | 10,037,284,144.43 | 10,037,273,924.05 | −1.02 |
| 693 | 712 | 10,312,500,000.00 | 10,037,306,882.02 | 10,037,273,924.05 | −3.28 |
| 766 | 787 | 10,312,500,000.00 | 10,037,325,285.90 | 10,037,273,924.05 | −5.12 |

TABLE 2-continued

Example M/N for Synchronous 10GBE transport over ODU2

| M | N | 10GBE | Result | ODU2 | Offset (PPM) |
|---|---|---|---|---|---|
| 839 | 862 | 10,312,500,000.00 | 10,037,340,487.24 | 10,037,273,924.05 | −6.63 |
| 875 | 899 | 10,312,500,000.00 | 10,037,194,104.56 | 10,037,273,924.05 | 7.95 |
| 912 | 937 | 10,312,500,000.00 | 10,037,353,255.07 | 10,037,273,924.05 | −7.90 |
| 2,151 | 2,210 | 10,312,500,000.00 | 10,037,188,914.03 | 10,037,273,924.05 | 8.47 |

TABLE 3

Example M/N for Synchronous 10GBE transport over OC192/STM64

| M | N | 10GBE | Result | OC192/STM64 | Offset (PPM) |
|---|---|---|---|---|---|
| 194 | 201 | 10,312,500,000.00 | 9,953,358,208.96 | 9,953,280,000.00 | −7.86 |
| 471 | 488 | 10,312,500,000.00 | 9,953,253,073.77 | 9,953,280,000.00 | 2.71 |
| 665 | 689 | 10,312,500,000.00 | 9,953,283,744.56 | 9,953,280,000.00 | −0.38 |
| 748 | 775 | 10,312,500,000.00 | 9,953,225,806.45 | 9,953,280,000.00 | 5.44 |

Note that the clock rates given by these tables are in bits per second. Generally, M and N are chosen so that the output of the transmit clock generator 18 is a standard OC192 or ODU2 or OTU2 clock within +/−10.8 ppm. M and N are chosen such that the ratio M/N produces a high enough clock rate to allow for low cost jitter filtering. For example, selecting M and N to be three digits each may provide acceptable jitter. Choosing M and N to be four digits each is also possible, but may require greater jitter compensation.

The data from the Ethernet that is framed by the Ethernet framer 14 is passed to an Ethernet/ODUk asynchronous mapper 20. The asynchronous mapper 20 asynchronously maps the Ethernet-framed data from the Ethernet to a standard OPUk payload using a generic framing procedure (GFP).

The asynchronously mapped data is sent to an OTUk framer 22 that frames the data according to an optical transport protocol. The OTUk frames from the OTUk framer 22 are passed to the transmit clock generator 18, which outputs the frames at the clock rate of the second clock signal.

In the reverse direction, data clocked at an OTU2 rate is received by a second clock and data recovery (CDR) unit 24. The second CDR unit 24 recovers the data in the received signal and also extracts a third clock signal from the received signal. The recovered data is transmitted to the OTUk framer 22 which frames the data according to the optical transport protocol. The output of the OTUk framer 22 is input to the Ethernet/ODUk asynchronous mapper 20 which asynchronously maps the OTUk framed data to a standard Ethernet payload. The Ethernet payload from the asynchronous mapper 20 is sent to the Ethernet framer 14, which formats the data in Ethernet frames to be transmitted to the Ethernet network.

The third clock signal from the CDR unit 24 is sent to an N/M synchronizer 26 which derives a fourth clock signal from the third clock signal. The output of the N/M synchronizer 26 is forwarded to a second transmit clock generator 28, which generates the fourth clock signal based on the output from the N/M synchronizer 26. The ratio of the fourth clock signal to the rate of the third clock signal is N/M, where M and N are integers. In one embodiment, the integers, M and N, are the same integers of the M/N synchronizer 16. Since the 10GBE signal is not mapped synchronously but the timing is, different M and N may be used for the upstream and the downstream, and the timing will remain synchronized between the networks.

Thus, the system 10 of FIG. 1 allows transparent synchronization between an Ethernet network and an optical transport network at an Ethernet-to-OTN transceiver. Note that since an OTU2 clock is 255/239 of an ODU2 clock, timing will be preserved when an ODU2 data packet is transported via an OTU2 link. Further, since the ODU2 packets may be multiplexed asynchronously onto an OTU3 link, or an OTU4 link, link, the ODU2 timing is preserved.

Figure 2:
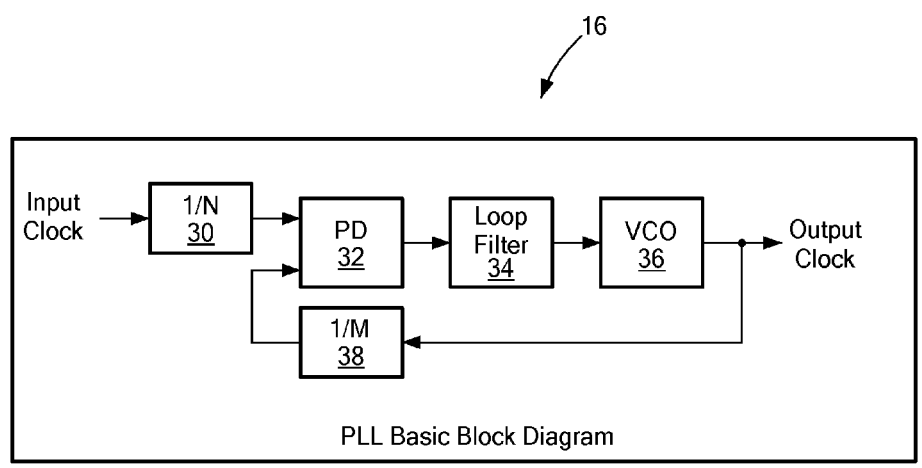
FIG. 2 is a block diagram of an exemplary M/N synchronizer implemented as a phase locked loop in accordance with principles of the present invention.

FIG. 2 is a block diagram of an M/N synchronizer 16 implemented as a phase locked loop (PLL). An input clock, such as the first clock from the CDR unit 12, is divided in a first divider 30 by 1/N. The output of the first divider 30 is input to a phase detector 32. An output of the phase detector 32 is input to a loop filter 34 which determines the bandwidth of the PLL. The output of the loop filter 34 is input to a voltage controlled oscillator (VCO) 36 which may be a voltage controlled crystal oscillator (VCXO). The output of the VCO 36 is the output clock which has a rate that is M/N times the rate of the input clock.

In a feedback path to the phase detector 32, the output clock is divided by M in a divider 38. Division by M increases the output clock rate, but has the effect of adding jitter to the output clock. The phase detector 32 compares the phase of the input clock divided by N to the phase of the output clock divided by M. If the input clock edge precedes the output clock edge, the VCO 36 is driven up in frequency until the input clock edge and the output clock edge are aligned. Conversely, if the output clock edge precedes the input clock edge, the VCO is driven down in frequency.

If the input clock is jitter free, the output clock will reach a stable frequency where the input edge and the output edge occur at the same time. If jitter is present in the input clock, the output frequency moves up or down to try to keep the input and output clock edges aligned. If, for example, the input jitter drives the output clock up in frequency, the VCO 36 continues to increase in frequency for M cycles of the output clock before comparison to the input clock by the phase detector 32. Thus, an input jitter of x results in Mx clock cycles of phased movement in the output. For this reason, the value of M should be chosen as low as possible to minimize jitter and increase stability of the output clock. As long as the loop bandwidth of the PLL is high enough (~300 Hz), the PLL is not a source of significant wander, so expensive and complicated wander control is not required. Note also that in some embodiments, jitter filtering can be performed downstream of the PLL.

Figure 3:
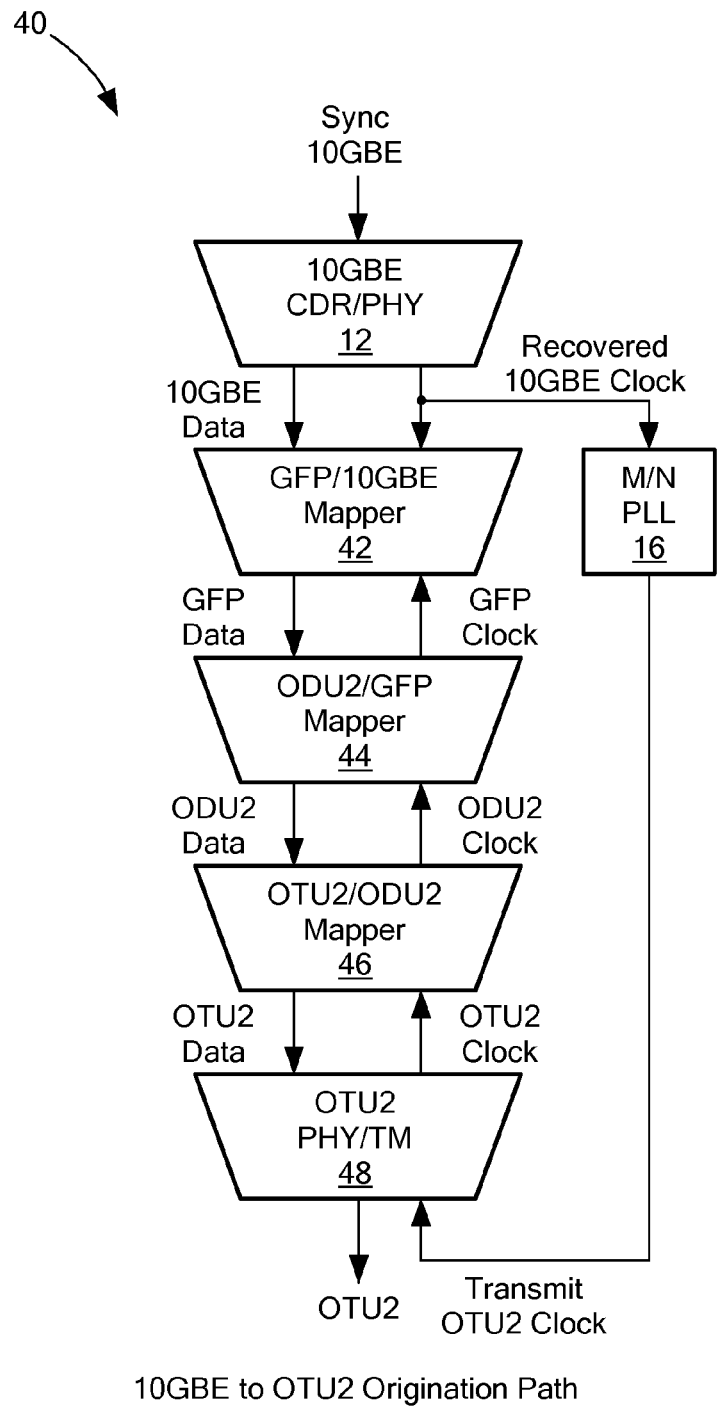
FIG. 3 is a block diagram of an exemplary origination path of a transceiver for synchronizing a 10GBE signal to an OTU2 transport signal constructed in accordance with principles of the present invention.

FIG. 3 is a block diagram of an origination path 40 of a transceiver for synchronizing a 10GBE signal to an OTU2 transport signal. A 10GBE signal is received from an Ethernet network by the CDR unit 12, which recovers the data and extracts the 10GBE clock signal from the received 10GBE signal. The data is passed to a GFP/10GBE mapper 42 to map the data using the generic framing procedure. The recovered 10GBE clock is passed to the M/N synchronizer 16 to be multiplied to the OTU2 clock rate.

The recovered 10GBE also terminates at the GFP mapper 42, which terminates the 10GBE frames and packs the 10GBE frames into GFP frames. The GFP data is passed to an ODU2/GFP mapper 44, which maps the GFP frames into ODU2 packets that are synchronized to the OTU2 clock. The ODU2 data is passed to the OTU2/ODU2 mapper 46, which maps the ODU2 data to OTU2 data that is synchronized to the OTU2 clock.

The transmit OTU2 clock, which is synchronized to the 10GBE clock through the M/N synchronizer 16, is passed to the PHY/TM 48. The PHY/TM 48 passes the OTU2 clock to the OTU2/ODU2 mapper 46. The PHY/TM 48 also uses the OTU2 clock to generate an OTU2 data stream synchronized to the 10GBE clock.

Figure 4:
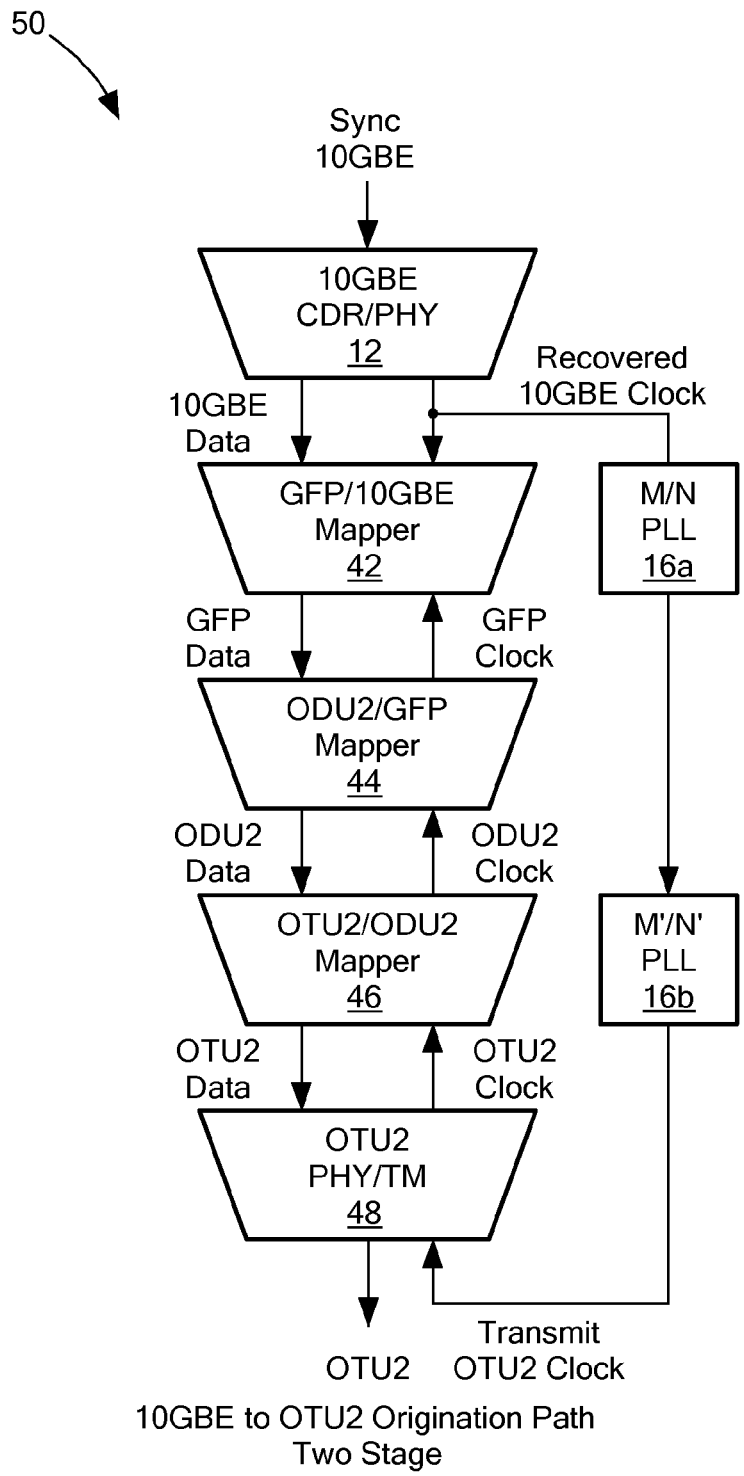
FIG. 4 is a block diagram of an exemplary origination path having two stages of clock synchronization constructed in accordance with principles of the present invention.

FIG. 4 is a block diagram of an origination path 50 of a transceiver for synchronizing a 10GBE signal to OTU2 transport signal. The origination path 50 of FIG. 4 is the same as the origination path 40 of FIG. 3, except that the synchronization function is in two stages. A first M/N synchronizer 16a generates a common system clock and a second M'/N' synchronizer 16b generates the OTU2 clock. In one embodiment, the M/N synchronizer 16a could be used to generate an ODU2 clock and the M'/N' synchronizer 16b can be used to generate the OTU2 transmit clock. In this embodiment M'/N' could be chosen as 255/239.

Figure 5:
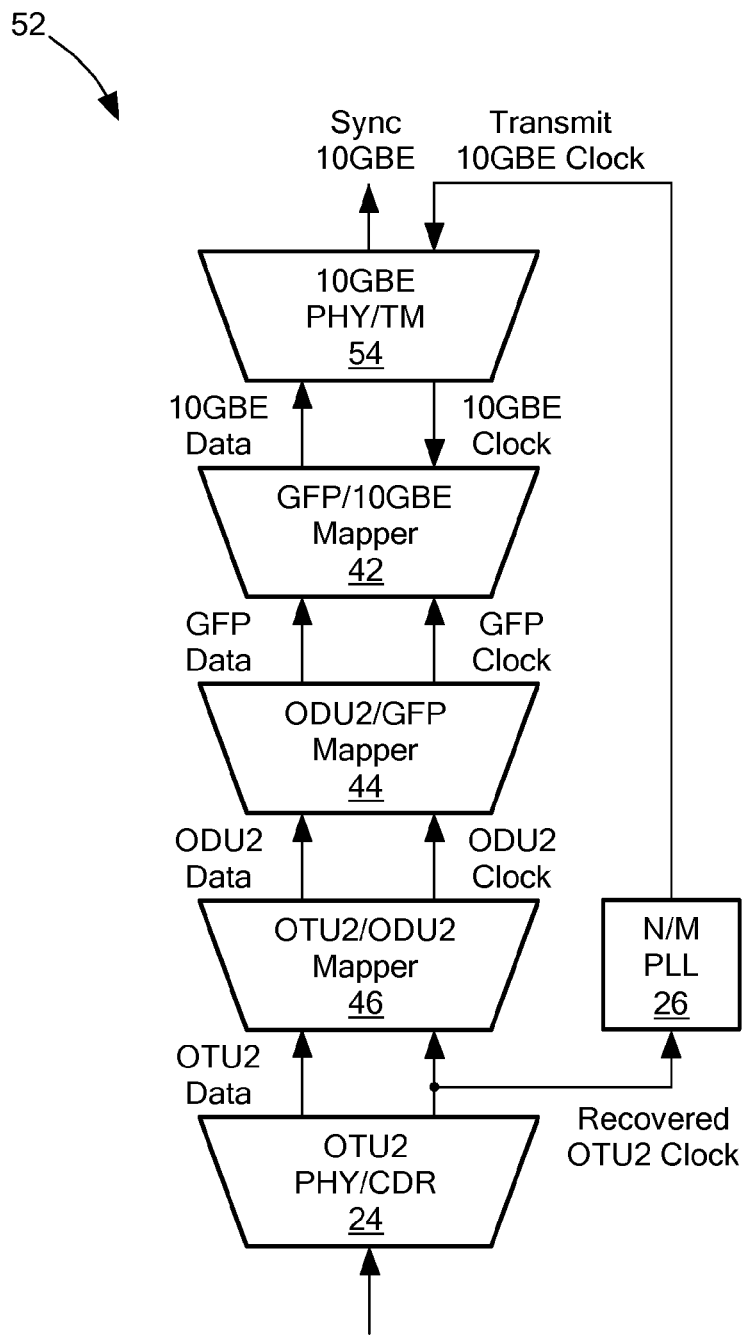
FIG. 5 is a block diagram of an exemplary termination path of a transceiver for synchronizing an OTU2 transport signal to a 10GBE signal constructed in accordance with principles of the present invention.

FIG. 5 is a block diagram of a termination path 52 of a transceiver for synchronizing an OTU2 transport signal to a 10GBE signal. The CDR unit 24 receives the OTU2 transport signal and recovers the data of the OTU2 transport signal and also recovers the OTU2 clock of the OTU2 transport signal. The recovered OTU2 clock is passed to the N/M synchronizer 26 to be divided down to the 10GBE clock rate. The recovered clock and data are also sent to the OTU2/ODU2 mapper 46. The OTU2/ODU2 mapper 46 terminates the OTU2 frames and packs them into ODU2 frames. The ODU2 frames are received by the ODU2/GFP mapper 44, which maps the ODU2 packets into GFP frames. The GFP frames are received by the GFP/10GBE mapper 42, which maps the GFP frames into 10GBE frames.

The 10GBE clock from the synchronizer 26 is passed to a 10GBE PHY/TM 54. The PHY/TM 54 passes the 10GBE clock to the GFP/10GBE mapper 42 and also uses the 10GBE clock to generate a 10GBE data stream synchronized to the OTU2 clock.

Figure 6:
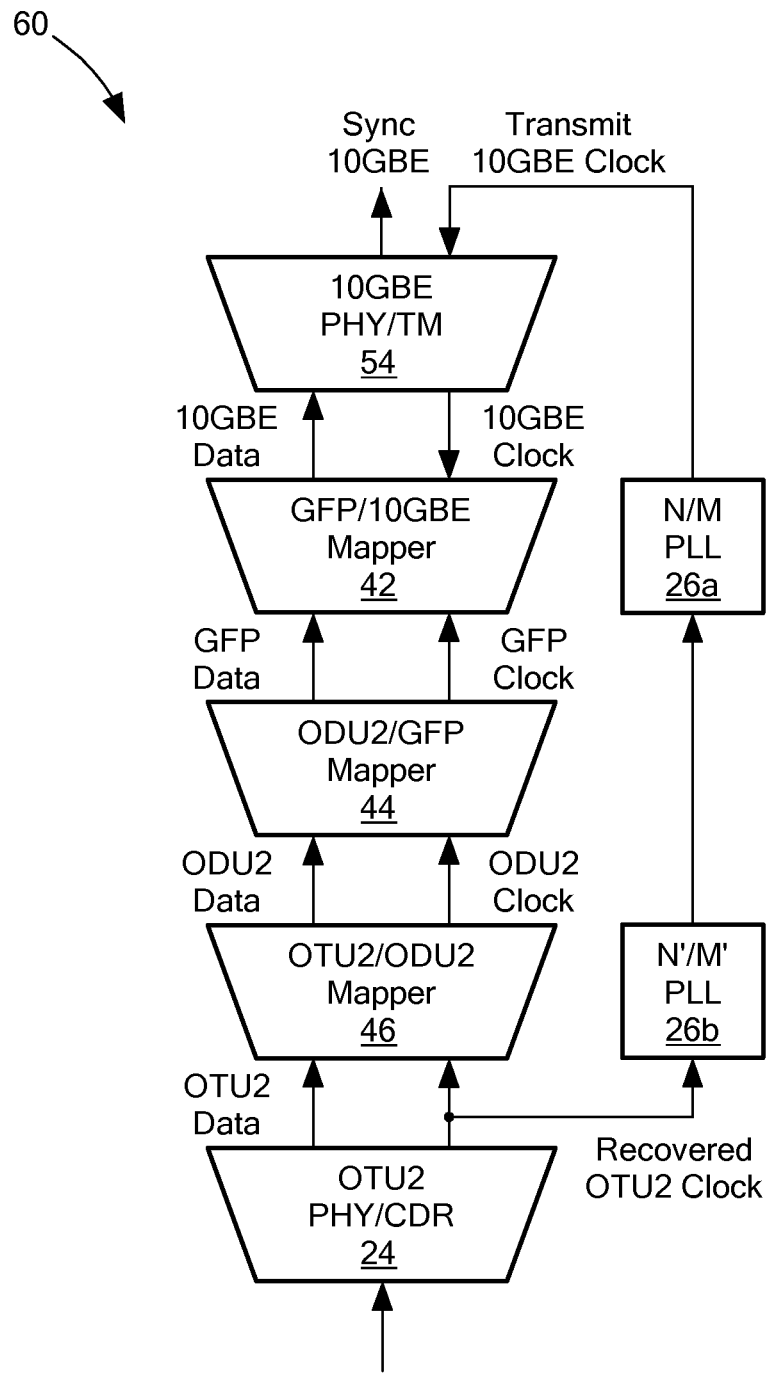
FIG. 6 is a block diagram of an exemplary termination path having two stages of clock synchronization constructed in accordance with principles of the present invention.

FIG. 6 is a block diagram of a termination path 60 of a transceiver for synchronizing an OTU2 transport signal to a 10GBE signal. The termination path 60 is the same as the termination path 52, except that the synchronization function is in two stages. A first N'/M' synchronizer 26b may be used to generate an ODU2 clock. The recovered ODU2 clock is input to an N/M synchronizer 26a which multiplies the ODU2 clock by, for example, 239/255 to generate the 10GBE clock.

Figure 7:
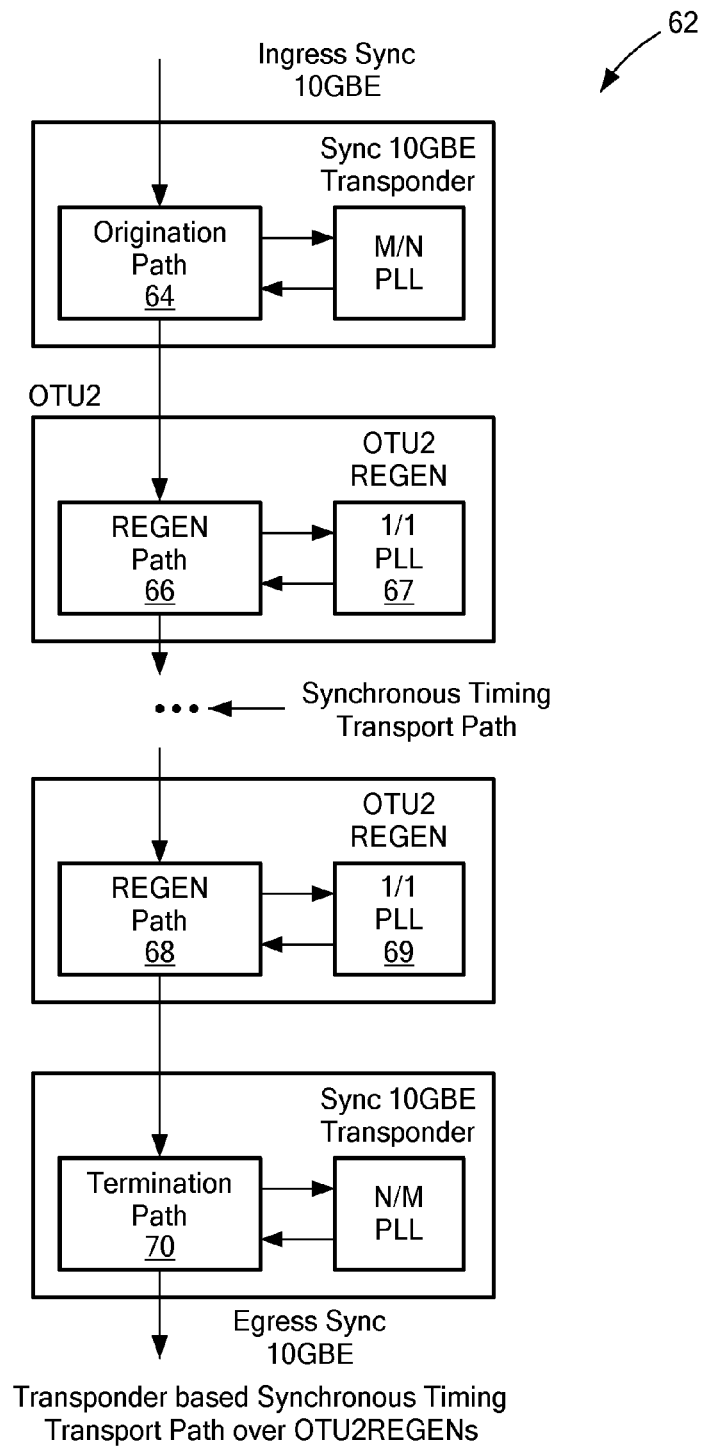
FIG. 7 is a block diagram of an exemplary end-to-end transport path with transponders at each end and intermediate regenerators, constructed in accordance with principles of the present invention.

FIG. 7 is a block diagram of an end-to-end transport path 62 with transponders 64 and 70 and intermediate regenerators 66 and 68. At each transponder 64 and 70, timing is synchronized as described above with reference to FIG. 3 and FIG. 4. Each regenerator 66 and 68 has a 1/1 phase locked loop 67 and 69, respectively, to synchronize the timing of the input and output of the regenerator. Thus, timing of the 10GBE network at one end of an optical transport link is synchronized with the timing of another 10GBE network at an opposite end of the optical transport link.

Figure 8:
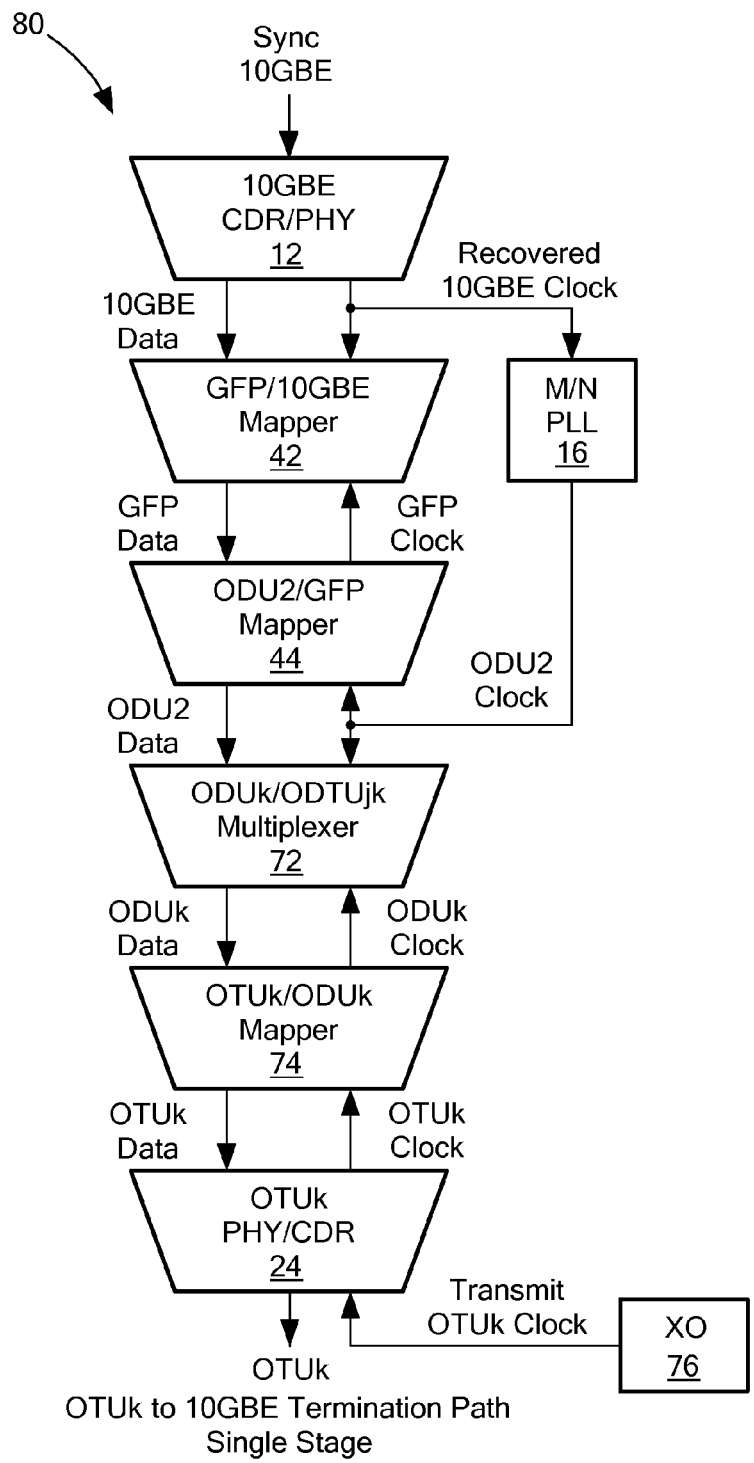
FIG. 8 is a block diagram of an exemplary origination path that includes multiplexing to an OTUk signal, constructed in accordance with principles of the present invention.

FIG. 8 is a block diagram of an origination path 80 for synchronization of a 10GBE signal to an ODU2 signal and then asynchronously multiplexing the ODU2 signal to an OTUk signal, where k is greater than 2. The CDR unit 12, the GFP/10GBE mapper 42, the ODU2/GFP mapper 44 function as described above with reference to FIG. 3. The M/N synchronizer 16 multiplies the 10GBE clock to produce an ODU2 clock.

The ODU2 clock is input to the ODU2/GFP mapper 44 and is used to adapt the GFP frames to the ODU2 by adding or removing idle codes. The ODU2 clock is also input to an ODUk/ODTUjk multiplexer 72. The ODUk/ODTUjk multiplexer 72 receives the ODU2 clock and the ODU2 data, and adapts the ODU2 timing to an ODUk timing base using asynchronous mapping procedure (AMP) or generic mapping procedure (GMP). ODUk data is passed from the ODUk/ODTUjk mapper 72 to an OTUk/ODUk mapper 74, which maps the ODUk data into the OTUk frames. The OTUk frames are synchronized to an OTUk transmit clock 76. The OTUk transmit clock is asynchronous to the ODU2 clock.

Figure 9:
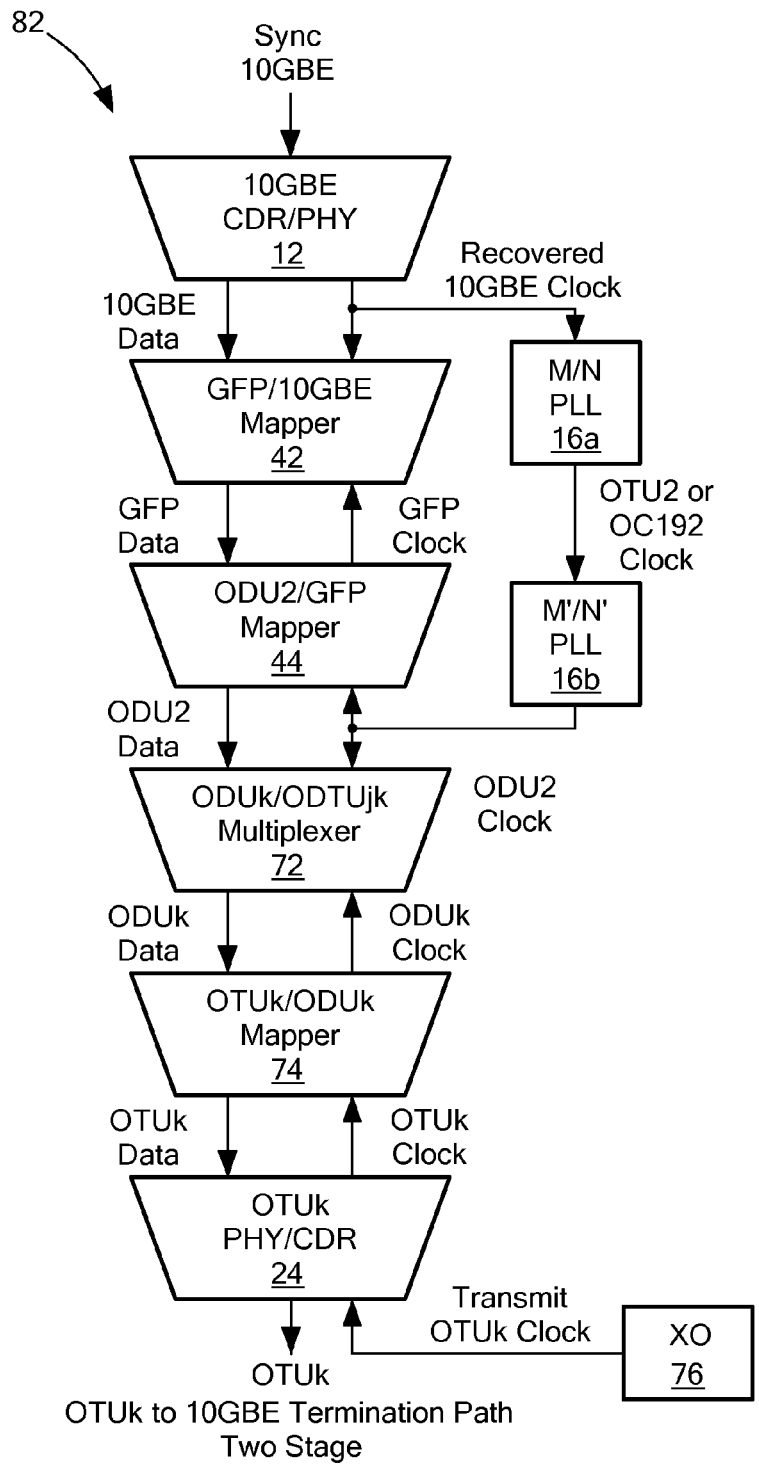
FIG. 9 is a block diagram of an exemplary origination path that includes multiplexing to an OTUk signal and two stages of clock synchronization constructed in accordance with principles of the present invention.

FIG. 9 is a block diagram of an origination path 82 that is the same as the origination path 80, except that the synchronization occurs in two stages. In particular, the M/N synchronizer 16a converts the recovered 10GBE clock to an OTU2 clock or an OC192 clock. The M'/N' synchronizer 16b, converts the output of the synchronizer 16a to the ODU2 clock, where M' and N' are integers.

Figure 10:
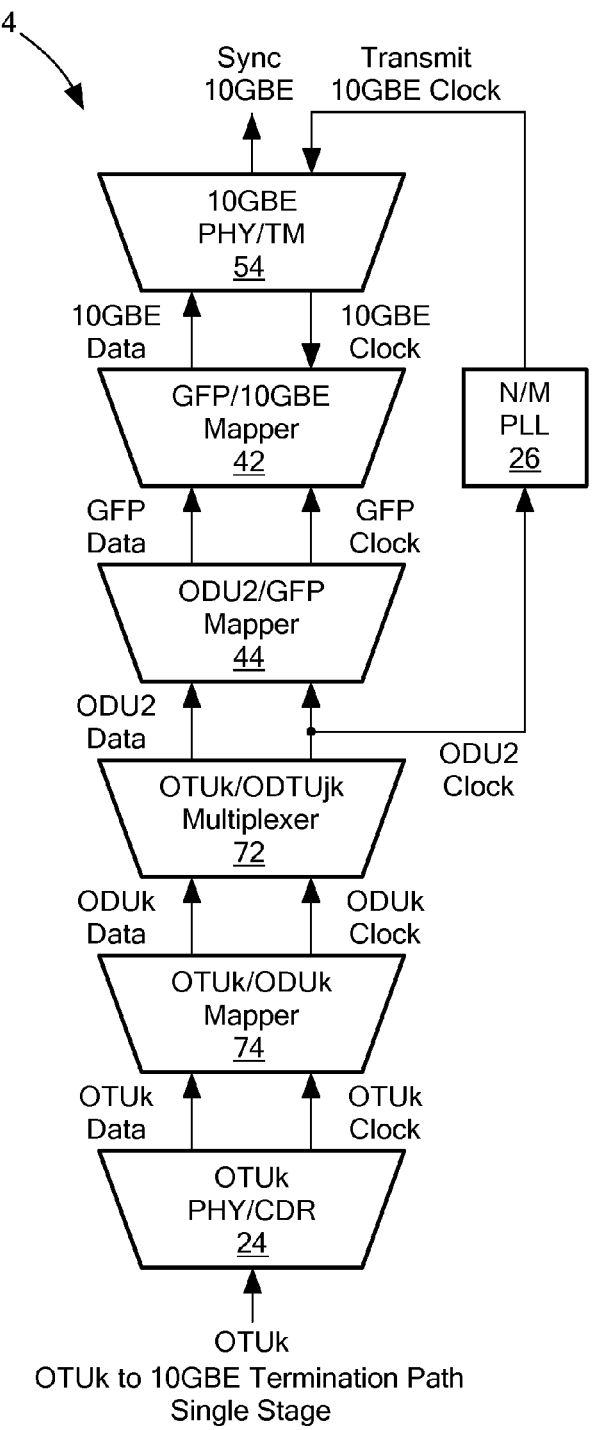
FIG. 10 is a block diagram of an exemplary termination path for a 10GBE signal multiplexed to an OTUk signal constructed in accordance with principles of the present invention.
Figure 11:
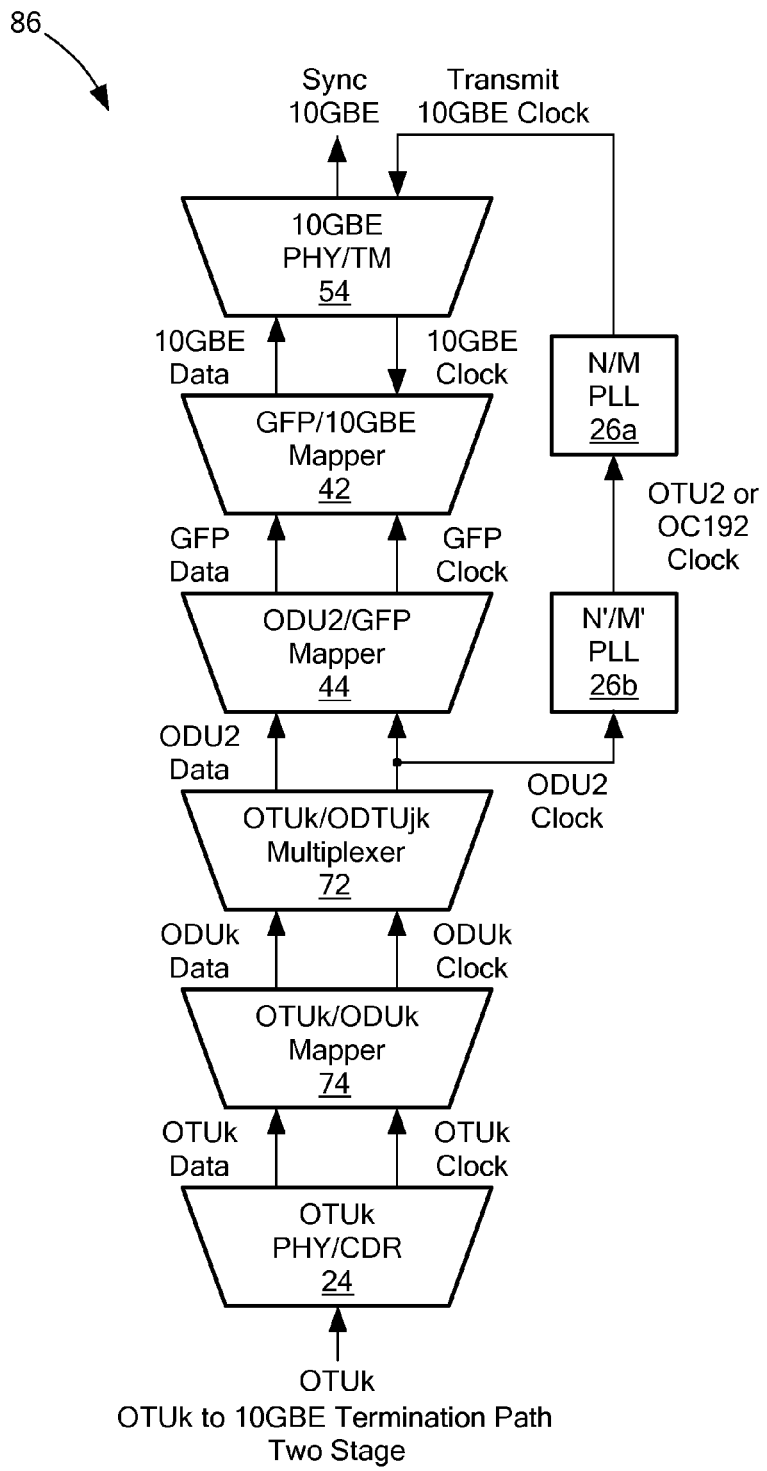
FIG. 11 is a block diagram of an exemplary 10GBE/OTUk termination path having two stages of clock synchronization constructed in accordance with principles of the present invention.

FIG. 10 is a block diagram of a termination path 84 for a 10GBE signal multiplexed to an OTUk signal. FIG. 11 is a block diagram of a termination path 86 that is the same as the termination path 84, except that synchronization occurs in two stages.

Figure 12:
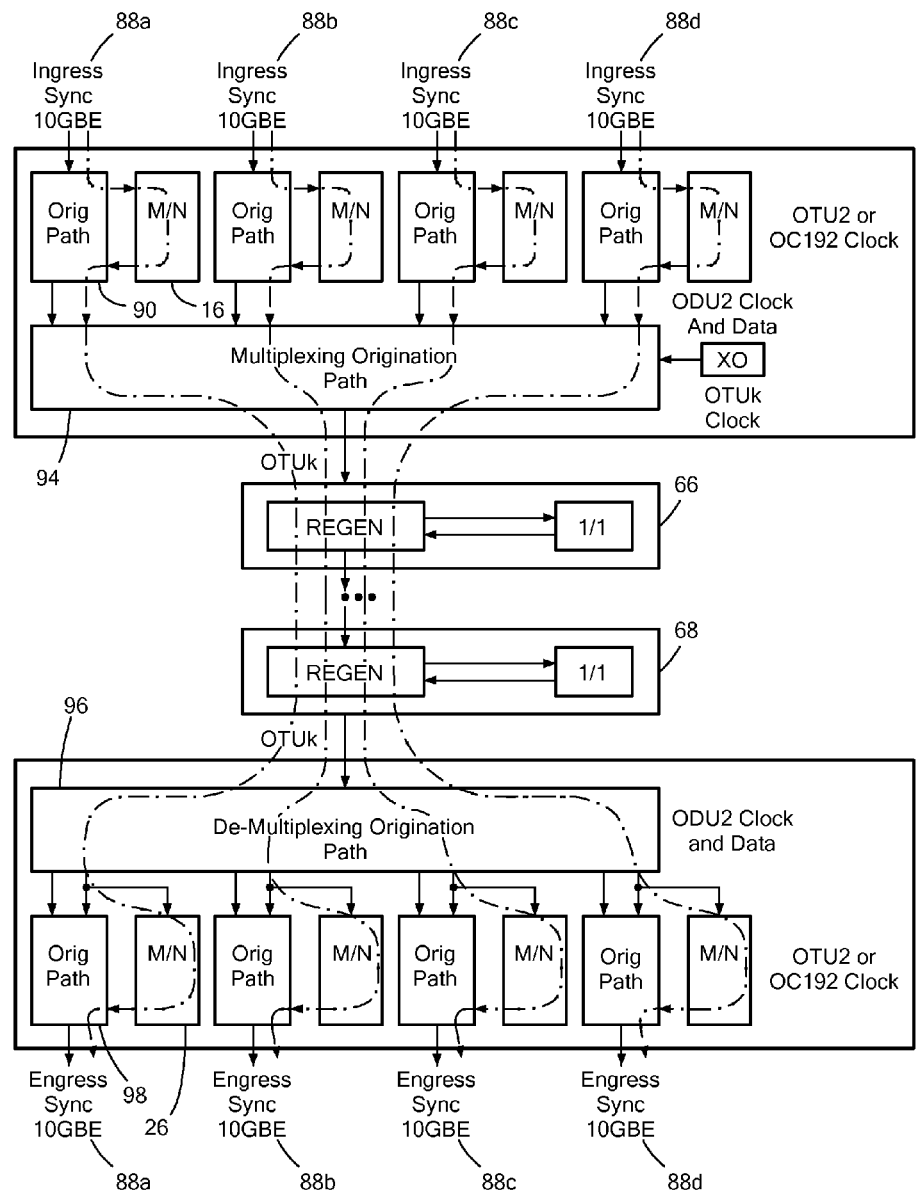
FIG. 12 is a block diagram of exemplary end-to-end transport path with multiplexers at each end and intermediate regenerators, constructed in accordance with principles of the present invention.

FIG. 12 is a block diagram of an end to end multiplexed 10GBE transport arrangement. FIG. 12 shows multiple 10GBE inputs to multiple paths 88a, 88b, 88c, 88d, herein collectively referred to as paths 88. Each of the paths 88 includes a data path 90 for data and a synchronization path having an M/N synchronizer 16. The M/N synchronizer multiplies a received 10GBE signal by M/N to obtain an ODU2 clock. The synchronized signals from each path 88 are multiplexed by a multiplexer 94 and transmitted on an OTUk link through regenerators 66 and 68. At a termination of the OTUk link is a de-multiplexer 96 which de-multiplexes the data to paths 88. Each path 88 includes a data path 98 and a synchronization path having an N/M synchronizer 26. The N/M synchronizer multiplies the ODU2 clock recovered from the signal of a path 88 by N/M to obtain a 10GBE clock synchronized to a 10GBE clock of the original input signals.

Thus, synchronization of 10GBE signals transported over an optical transport network is achieved by using one or more M/N synchronizers. Exemplary signals of an OTN may be related by integers M and N as follows:

$$OC192*239/237=ODU2$$

$$OC192*255/237=OTU2$$

$$ODU2*255/239=OTU2$$

GBE*2151/2210=ODU2

GBE*27/26=OTU2

As noted above, the choice of M/N affects the extent of jitter in the PLL used to implement the M/N synchronizer. In particular, the jitter is multiplied by M in the PLL. Division of the input clock by N has little effect upon jitter. Thus, picking a small value for M (which leads to a small value of N) helps reduce jitter. However, if ODU2 jitter cannot be controlled, two stages of synchronization can be applied: a first stage (27/26) to convert the 10GBE signal to OTU2 and then a second stage (239/255) to obtain the desired ODU2 rate.

Also, the bandwidth of the loop filter 34 affects the jitter. Generally, the larger the bandwidth of the loop filter, the faster the PLL will acquire phase lock and the faster the PLL will respond to changes in the clock. Conversely, a low loop bandwidth slows the rate of jitter. A loop filter operating at 300 Hertz bandwidth provides adequate jitter filtering in some embodiments.

Figure 13:
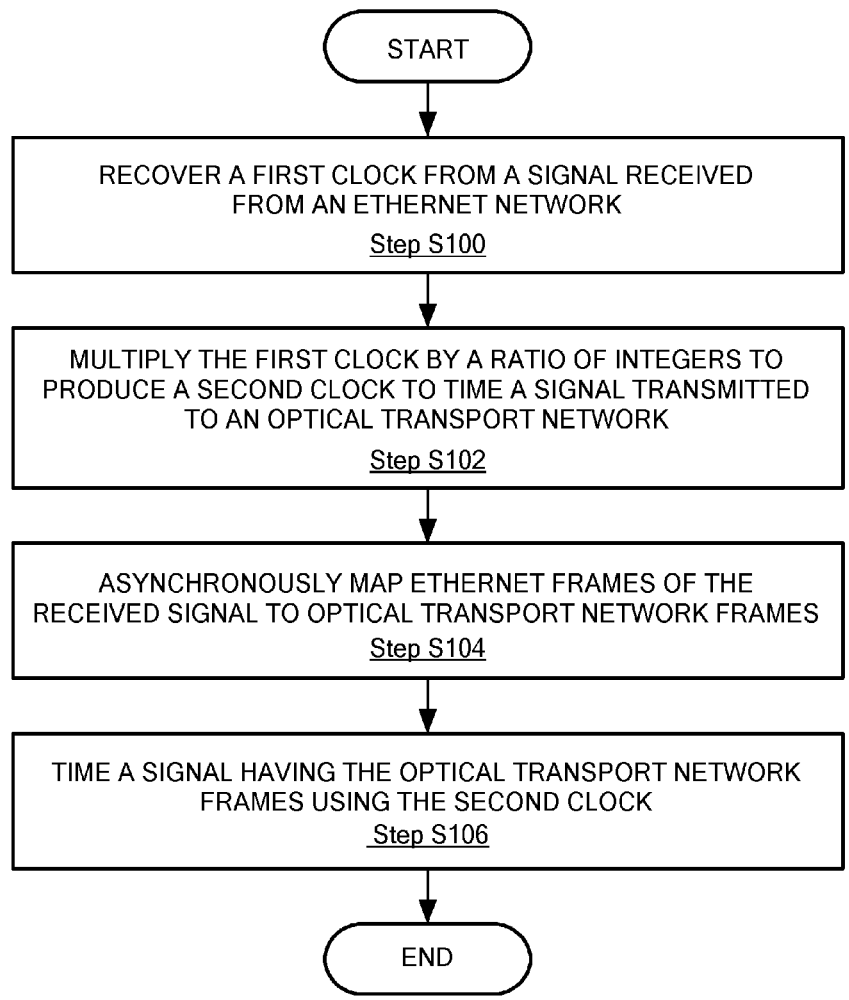
FIG. 13 is a flow chart of an exemplary process for synchronous timing and asynchronous mapping of a 10GBE signal to an optical transport network.

FIG. 13 is a flow chart of an exemplary process for synchronous timing and asynchronous mapping of a 10GBE signal to an optical transport network A first clock is recovered from a signal received from an Ethernet network (step S100) by a CDR unit 12. The first clock is multiplied by a ratio of integers M/N in an M/N synchronizer 16 to produce a second clock to time a signal transmitted to an optical transport network (step S102). The frames of the signal received from the Ethernet network are asynchronously mapped to frames of the optical transport network (step S104) by an asynchronous mapper 20. The signal transmitted over the optical transport network is timed by the second clock (step S106).

The present invention can be realized in hardware, or a combination of hardware and software. Any kind of computing system, or other apparatus adapted for carrying out the methods described herein, is suited to perform the functions described herein. A typical combination of hardware and software could be a specialized computer system, having one or more processing elements and a computer program stored on a storage medium that, when loaded and executed, controls the computer system such that it carries out the methods described herein. The present invention can also be embedded in a computer program product, which comprises all the features enabling the implementation of the methods described herein, and which, when loaded in a computing system is able to carry out these methods. Storage medium refers to any volatile or non-volatile storage device.

Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

What is claimed is:

1. A transceiver, comprising:
   a first clock recovery circuit, the first clock recovery circuit configured to recover a first clock signal from a first signal received from an Ethernet network;
   a first synchronizer, the first synchronizer configured to multiply the first clock signal by a ratio M/N to produce a second clock signal to time a second signal transmitted to an optical transport network, where M and N are integers, wherein M and N are selected based on a rate of the first signal received from the Ethernet network and a rate of the second signal transmitted to the optical transport network; and
   an asynchronous mapper, the asynchronous mapper configured to asynchronously map frames of the first signal to produce frames of the second signal, wherein each of the first signal and the second signal are synchronous to one another based on the ratio M/N.

2. The transceiver of claim 1, further comprising:
   a second clock recovery circuit, the second clock recovery circuit configured to recover a third clock signal from a third signal received from the optical transport network; and
   a second synchronizer, the second synchronizer configured to multiply the third clock signal by a ratio N/M to produce a fourth clock signal to time a fourth signal transmitted to the Ethernet network;
   wherein the asynchronous mapper de-maps frames of the third signal to produce frames of the fourth signal.

3. The transceiver of claim 2, wherein the asynchronous mapper is clocked by the second clock signal to map Ethernet frames to optical transport network frames and is clocked by the fourth clock signal to map optical transport network frames to Ethernet frames.

4. The transceiver of claim 1, wherein M and N are selected to achieve a deviation between the second clock signal, which is derived from the Ethernet network, and a standard OTU2 clock of 10.70922531646 Giga-Hertz that is less than about 10.8 parts per million.

5. The transceiver of claim 1, where M and N are selected to achieve a deviation between the second clock signal, which is derived from the Ethernet network, and a standard ODU2 clock of 10.03727392405 Giga-Hertz that is less than about 10.8 parts per million.

6. The transceiver of claim 1, where M and N are selected to achieve a deviation between the second clock signal, which is derived from the Ethernet network, and a standard OC192 clock of 9.9532800000 Giga-Hertz that is less than about 10.8 parts per million.

7. The transceiver of claim 1, wherein M is selected to produce a clock signal that exhibits an output jitter that is less than a predetermined amount.

8. The transceiver of claim 1, wherein the second clock signal is an OTU2 clock signal, and further comprising a second synchronizer configured to multiply the second clock signal by 239/255 to produce an ODU2 clock signal.

9. A transceiver, comprising:
   a receiver, the receiver configured to receive a first signal from an Ethernet network and recover a first clock signal from the first signal;
   a phase locked loop, the phase locked loop configured to convert the first clock signal to a second clock signal, the conversion including multiplying the first clock signal by a ratio of integers M/N, wherein M and N are selected based on a rate of the first signal from the Ethernet network and a rate of the second signal to an optical transport network;
   a GFP/Ethernet mapper, the GFP/Ethernet mapper configured to asynchronously map Ethernet frames clocked at a rate of the first clock signal to GFP frames clocked at a rate of a third clock signal derived from the second clock signal; and an ODU2/GFP mapper, the ODU2/GFP mapper configured to asynchronously map the GFP frames to ODU2 frames clocked at a rate of the second clock signal, wherein each of the first clock signal and the second clock signal are synchronous to one another based on the ratio M/N.

10. The transceiver of claim 9, further comprising an ODUk/ODTUjk multiplexer, the ODUk/ODTUjk multiplexer configured to multiplex the ODU2 frames to produce an ODUk data stream.

11. The transceiver of claim 10, wherein the ODUk/ODTUjk multiplexer is clocked by an ODUk clock signal.

12. The transceiver of claim 11, further comprising an OTUk/ODUk mapper, the OTUk/ODUk mapper configured to map the ODUk data stream to an OTUk data stream.

13. The transceiver of claim 12, wherein the OTUk/ODUk mapper is clocked by an OTUk clock signal.

14. A clock distribution method between Ethernet and optical transport network, comprising:

recovering a first clock signal from a first signal received from an Ethernet network;

multiplying the first clock signal by a ratio of two integers, M/N, to obtain a second clock signal for timing a second signal transmitted over an optical transport network, wherein M and N are selected based on a rate of the first signal received from the Ethernet network and a rate of the second signal transmitted to the optical transport network;

asynchronously mapping frames of the signal from an Ethernet format to an OTU format, wherein each of the first signal and the second signal are synchronous to one another based on the ratio M/N;

transmitting the asynchronously mapped frames according to the second clock signal over the optical transport network.

15. The method of claim 14, wherein the first clock signal is an Ethernet clock signal having a frequency of about 10.3125 Giga-Hertz and the second clock signal is an OTU2 clock signal having a frequency of about 10.709 Giga-Hertz.

16. The method of claim 15, wherein a deviation of the second clock signal from an OTU2 standard clock of 10.70922531646 Giga-Hertz is less than 10.8 parts per million.

17. The method of claim 15, wherein a deviation of the second clock signal from an OTU2 standard clock signal of 10.70922531646 Giga-Hertz is less than 5 parts per million.

18. The method of claim 14, wherein the first clock signal is an Ethernet clock signal having a frequency of about 10.312500 Giga-Hertz and the second clock signal is an ODU2 clock signal having a frequency of about 10.037 Giga-Hertz.

19. The method of claim 14, wherein the first clock signal is an Ethernet clock signal having a frequency of about 10.312500 Giga-Hertz and the second clock signal is an OC192 clock signal having a frequency of about 9.953 Giga-Hertz.

20. The method of claim 14, further comprising:

recovering a third clock signal from a third signal received from the optical transport network; and multiplying the third clock signal by a ratio of the two integers, N/M, to obtain a fourth clock signal for timing a fourth signal transmitted over the Ethernet network.

* * * * *